United States Patent [19]
Guliani et al.

[11] Patent Number: 6,072,723
[45] Date of Patent: Jun. 6, 2000

[54] METHOD AND APPARATUS FOR PROVIDING REDUNDANCY IN NON-VOLATILE MEMORY DEVICES

[75] Inventors: Sandeep K. Guliani; Binh N. Ngo, both of Folsom, Calif.

[73] Assignee: Intel Corporation, Santa Clara, Calif.

[21] Appl. No.: 09/306,322

[22] Filed: May 6, 1999

[51] Int. Cl.$^7$ .................................................. G11C 16/00
[52] U.S. Cl. ................................ 365/185.18; 365/189.09
[58] Field of Search ...................... 365/185.18, 185.09, 365/189.09, 229

[56] References Cited

U.S. PATENT DOCUMENTS

| | | | |
|---|---|---|---|
| 4,817,055 | 3/1989 | Arakawa et al. | 365/185.18 |
| 4,843,594 | 6/1989 | Tanaka et al. | 365/189.09 |
| 5,267,213 | 11/1993 | Sung et al. | 365/185.18 |
| 5,296,801 | 3/1994 | Ohtsuka et al. | 365/189.09 |
| 5,444,659 | 8/1995 | Yokokura | 365/189.09 |
| 5,499,217 | 3/1996 | Pascucci et al. | 365/189.09 |
| 5,859,797 | 1/1999 | Maccarrone et al. | 365/189.09 |

*Primary Examiner*—Tan T. Nguyen
*Attorney, Agent, or Firm*—Blakely, Sokoloff, Taylor & Zafman LLP

[57] ABSTRACT

A bias circuit for a memory cell having first and second floating gate devices, and third and fourth reference devices, one of which has an output terminal coupled thereto is described. In one embodiment, the bias circuit includes a first capacitor including a first terminal coupled to the gates of the first and second devices, and a second terminal coupled to a power supply terminal, and a second capacitor including a first terminal coupled to the gates of the third and fourth devices, and a second terminal coupled to the power supply terminal. The bias circuit further includes a reference circuit including a first terminal having a first signal thereon and coupled to the gates of the first and second devices, and a second terminal having a second signal thereon and coupled to the gates of the third and fourth devices, the reference circuit to periodically turn on the first and second signals. The bias circuit reduces standby current and wake up time of redundant circuits in non-volatile memory devices.

22 Claims, 4 Drawing Sheets

METHOD AND APPARATUS FOR PROVIDING REDUNDANCY IN NON-VOLATILE MEMORY DEVICES

BACKGROUND OF THE INVENTION

1. Field of the Invention

The present invention relates generally to the field of non-volatile memories, and specifically to a method and apparatus for reducing standby current and wake up time of redundant circuits in non-volatile memory devices.

2. Background Information

Non-volatile memory devices such as electrically erasable programmable read only memory ("EEPROM") or FLASH devices typically include an array of storage cells. In addition, such non-volatile memory devices include configurable storage cells, apart from the array of storage cells, which are programmed in the factory before shipping to customers. These programmable storage cells are sometimes referred to as content address memories ("CAMs"). The typical usage of CAMs include: (1) Storing addresses of bad rows and/or columns in the main array so that an incoming address to a bad row or column is diverted to a redundant row or column; (2) Storing trim setting for critical circuits that are required to be trimmed; and (3) Configuring various line items such as top or bottom boot for different customers.

One requirement is that the CAMs must have their outputs ready during read and standby conditions. This typically requires a gate voltage of greater than 2.7 volts (greater than the threshold voltage of the storage cell) and a drain voltage of 1 volt. One prior art technique involved using $V_{CC}$ for the gate and a bias generator circuit for generating the drain voltage. The bias circuit typically consumed about 2.5 micro amps ($\mu a$) of current, which is a significant portion of the total standby current of 10 $\mu a$. Since this current is high for standby, a prior art technique involved shutting down the bias circuit in deep power down mode. However, transitioning from deep power down mode requires turning on the bias circuit, which typically takes 600 nanoseconds. Moreover, since $V_{cc}$ was used for the CAM gates, the scheme did not work for lower $V_{CC}$ voltages such as 1.8 volts because the threshold voltage of a non-volatile storage cell is as high as 2.5 volts.

SUMMARY OF THE INVENTION

The present invention comprises a bias circuit for a memory cell having first and second floating gate devices, and third and fourth reference devices, one of which has an output terminal coupled thereto. In one embodiment, the bias circuit includes a first capacitor including a first terminal coupled to the gates of the first and second devices, and a second terminal coupled to a power supply terminal, and a second capacitor including a first terminal coupled to the gates of the third and fourth devices, and a second terminal coupled to the power supply terminal. The bias circuit further includes a reference circuit including a first terminal having a first signal thereon and coupled to the gates of the first and second devices, and a second terminal having a second signal thereon and coupled to the gates of the third and fourth devices, the reference circuit to periodically turn on the first and second signals.

Other embodiments are shown and described.

DETAILED DESCRIPTION

The present invention comprises a method and apparatus for reducing standby current and wake-up time of non-volatile memories. Embodiments of the present invention include a sample and hold scheme for generating CAM gate and drain reference voltages. The present invention includes a reference circuit that is turned on periodically to refresh the CAM gate and drain reference voltages during standby and deep power down modes. This reduces the transition time from deep power down mode to active mode from 600 nanoseconds to 100 nanoseconds, i.e., as fast as a read during active mode. The bias current is off during standby mode so that standby current is also reduced.

Figure 1:
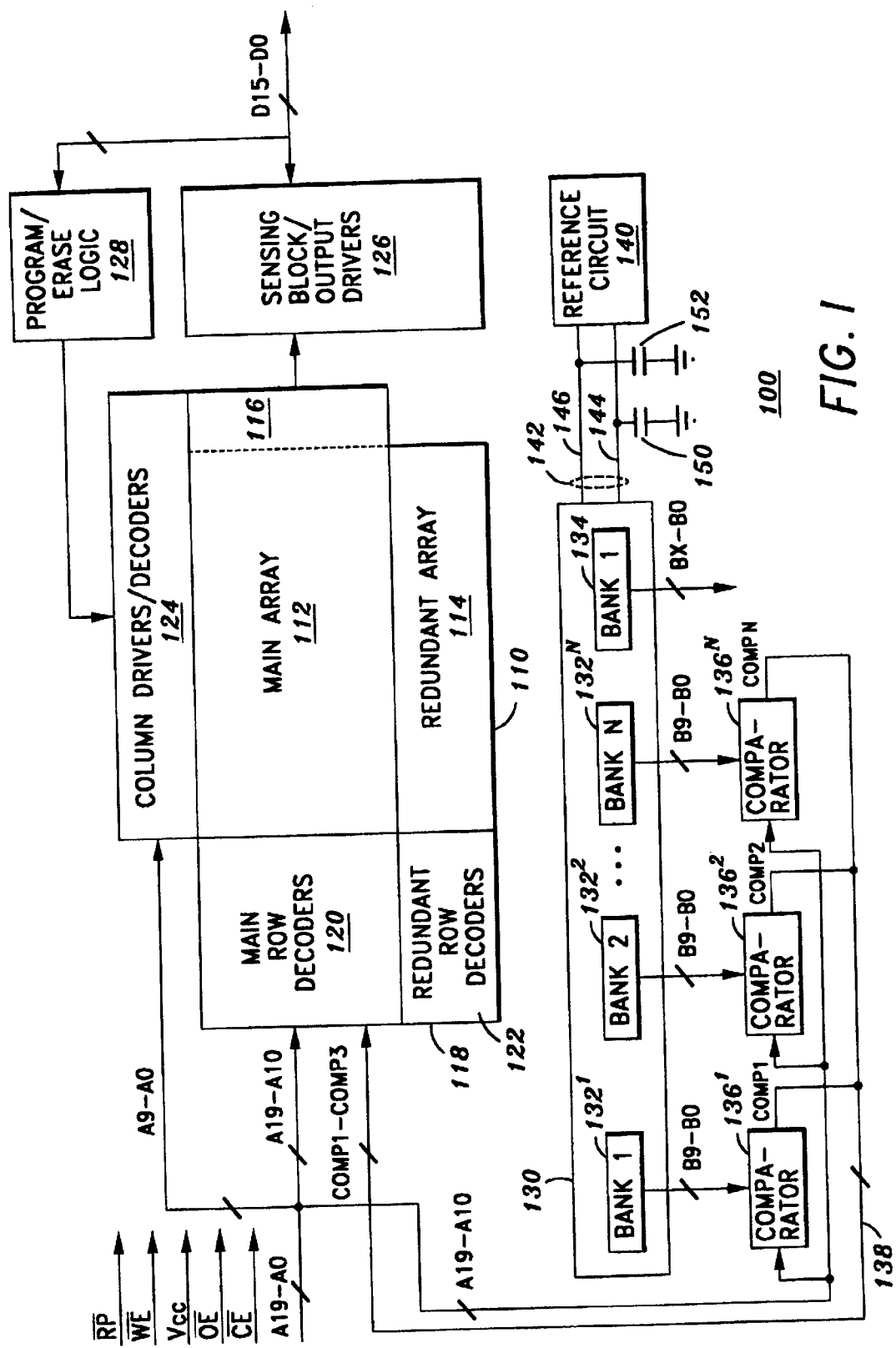
FIG. 1 illustrates a block diagram of a non-volatile memory device, according to one embodiment of the present invention.

FIG. 1 illustrates a block diagram of a non-volatile memory device 100, according to one embodiment of the present invention. The memory device 100 may be a FLASH, EEPROM, or other type of non-volatile memory devices.

Referring to FIG. 1, the memory device 100 includes a memory array 110 divided into a main memory array 112 and a redundant memory array 114. In one embodiment, the main memory array 112 stores 16 Megabits of information arranged in 1,024 rows and 16,384 columns of memory cells in the main memory array 112. The columns are broken up into 1,024 blocks of 16 columns each. The redundant memory array 114 includes a plurality of rows and 16,3844 columns of memory cells. Note that any other memory organization may be used, without departing from the spirit and scope of the present invention.

The memory device 100 includes address lines A19–A0 for addressing up to 16 Megabits of memory, data lines D15–D0, a chip enable line CE*, an output enable line OE*, a write enable line WE* for enabling programming of the memory cells, a power supply line $V_{CC}$, and reset signal RP* for placing the device 100 into deep power down mode. Note that the * after a signal name denotes that the signal is an active low signal. When the CE* is asserted, the device 100 is in the standby mode, and when de-asserted, the device 100 is in the active mode. In one embodiment, $V_{CC}$ is 1.8 volts.

Also shown in FIG. 1 are row decoders 118 divided into main row decoders 120 for driving the plurality of rows in the main memory array 112 and redundant row decoders 122 for driving a plurality of rows in the redundant memory array 114, and column drivers/decoders 124 for driving the columns in the memory array 110. Address lines A19–A10 are coupled to the row decoders 120 for selecting one of 1,024 rows. Moreover, address lines A9–A0 are coupled to the column drivers/decoders 124 for selecting one of 1,024 blocks of columns, where there are 16 columns per column. Since device 100 includes sixteen data lines (D15–D0), sixteen columns of memory cells are enabled in a selected row at the same time. A sensing block/output drivers 126 is used to sense the voltage on the storage cells and drive the data lines D15–D0, while program/erase logic 128 is used for programming and erasing memory cells in the memory array 110.

The memory device 100 further includes a CAM memory array 130, which may be next to the main memory array 112 and use the same decode lines, as shown by numeral 116. The CAM memory array 130 includes a plurality of memory banks 132$^1$–132$^N$, where "N" is a positive whole number. Memory banks 132$^1$–132$^N$ each includes 10 CAM cells which provide outputs B9–B0 to first inputs of respective comparators 136$^1$–136$^N$. It must be noted that each memory bank 132 may include more or less CAM cells (and thus outputs) depending on the number of rows, columns, etc. In this embodiment, the 10 CAM cells for each memory bank 132 corresponds to the number of row address lines (A19–A10).

Also coupled to the memory banks 132$^1$–132$^N$ in the CAM memory array 130 is a reference circuit 140, by way of signal lines 142, which provides bias for the CAM cells. The signal lines 142 include a first signal line 144 having a REF signal thereon, and a second signal line 146 having a GATE signal thereon. A first capacitor is coupled between the first signal line 144 and ground, and a second capacitor 152 is coupled between the second signal line 146 and ground. In another embodiment, the first and second capacitors 150 and 152 may be contained within the reference circuit 140. The reference circuit 140 receives the power supply voltage VCC and provides a step up voltage on signal lines 144 and 146. In one embodiment, the reference circuit 140 provides a step up voltage such that the REF signal is about 2 volts and the GATE signal is about 4 volts. However, other voltages may be used in lieu thereof.

When the device 100 initially powers up, the reference circuit 140 asserts the REF and GATE signals on signal lines 144 and 146, respectively, to charge up respective capacitors 150 and 152. A short time thereafter, the reference circuit 140 enters a periodic mode where the REF and GATE signals are periodically turned on and off (e.g., turned on every few milliseconds). During the ON period, the reference circuit 140 replenishes the charge lost by capacitors 150 and 152 during the OFF period. The time period between ON periods, and the duty cycle of the REF and GATE signals may vary depending on the application. Even in deep power down mode (RP* asserted) and standby mode (CE* de-asserted), the reference circuit 140 remains in the periodic mode to charge capacitors 150 and 152. The combination of the reference circuit 140 and the capacitors 150 and 152 provide a sample and hold scheme for generating CAM gate and drain reference voltages, as will be described in more detail in the following paragraphs.

Address lines A19–A10 are coupled to second inputs of comparators 136$^1$–136$^N$. Comparators 136$^1$–136$^N$ include outputs COMP$^1$–COMP$^N$ which are coupled to row decoders 118. To increase production yield of the memory device 100, the memory banks 136$^1$–136$^N$ are programmed in the factory with the address of bad rows in the main memory array 112. The comparators 136$^1$–136$^N$ compare the incoming address (address lines A19–A10) with the B9–B0 outputs of respective memory banks 132$^1$–132$^N$. If there is a match, indicating that there is a bad row in the main memory array 112, one of the comparator outputs COMP$^1$–COMP$^N$ will be asserted, while the rest will remain de-asserted. The row decoders 118 include logic, which in response to one of the comparator outputs COMP$^1$–COMP$^N$ being asserted, will disable the row decoder of the bad row and enable a redundant row decoder.

The CAM memory array 130 further includes memory bank 134, which includes a plurality of CAM cells having outputs BX–B0, where "X" is a positive whole number. These outputs are trimming bits used by trimming circuits contained within the device 100 (not shown). The trimming bits may be used for setting parameters for output drivers/sensing circuit, program/erase logic, etc. For example, in one embodiment, the memory bank 134 provides three outputs to trim the strength of the output drivers 126 to one of eight possible levels. The device 100 is then characterized to determine the driver level that provides the best transition time and performance of the data bus, while minimizing noise. Once such level is determined, the CAM cells in the memory bank 134 are programmed in the factory.

Figure 2:
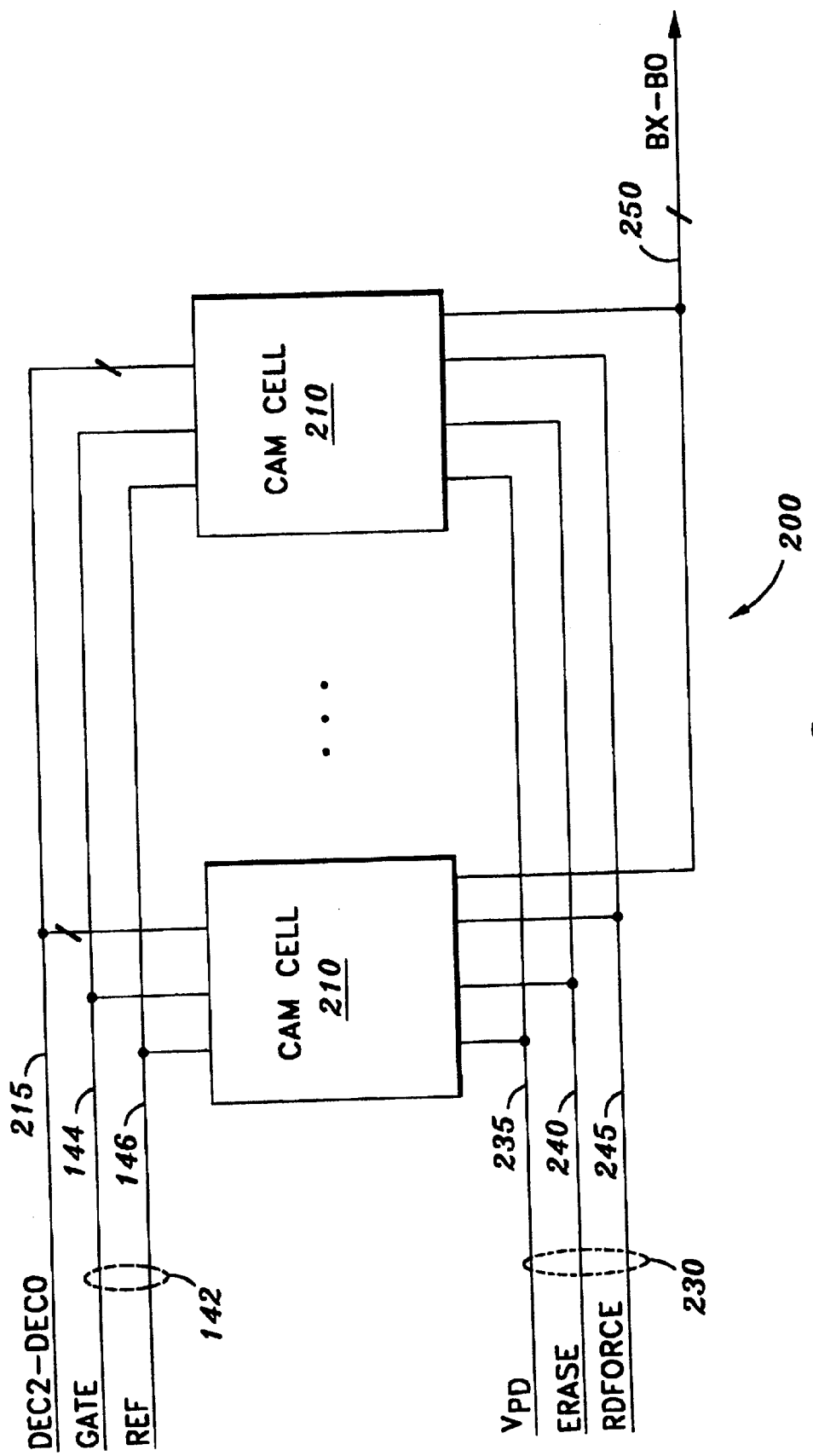
FIG. 2 illustrates a block diagram of a memory bank of CAM cells, according to one embodiment of the present invention.

FIG. 2 illustrates a block diagram of a memory bank 200 of CAM cells, according to one embodiment of the present invention. Referring to FIG. 2, the memory bank 200 includes a plurality of CAM cells designated by numeral 210. Coupled to each CAM cell 210 are decode signal lines 215 having DEC2–DEC0 signals thereon, signal lines 144 and 146 having REF and GATE signals thereon, and signal lines 230. The decode signal lines 215 are used to decode the CAM cells for programming. The signal lines 230 include a voltage drain signal $V_{PD}$ on signal lines 235, an ERASE signal on signal line 240, and a RDFORCE signal on signal line 245. These signals will be described in more detail in FIG. 3. The CAM cells 210 have outputs BX–B0 on signal lines 250.

Figure 3:
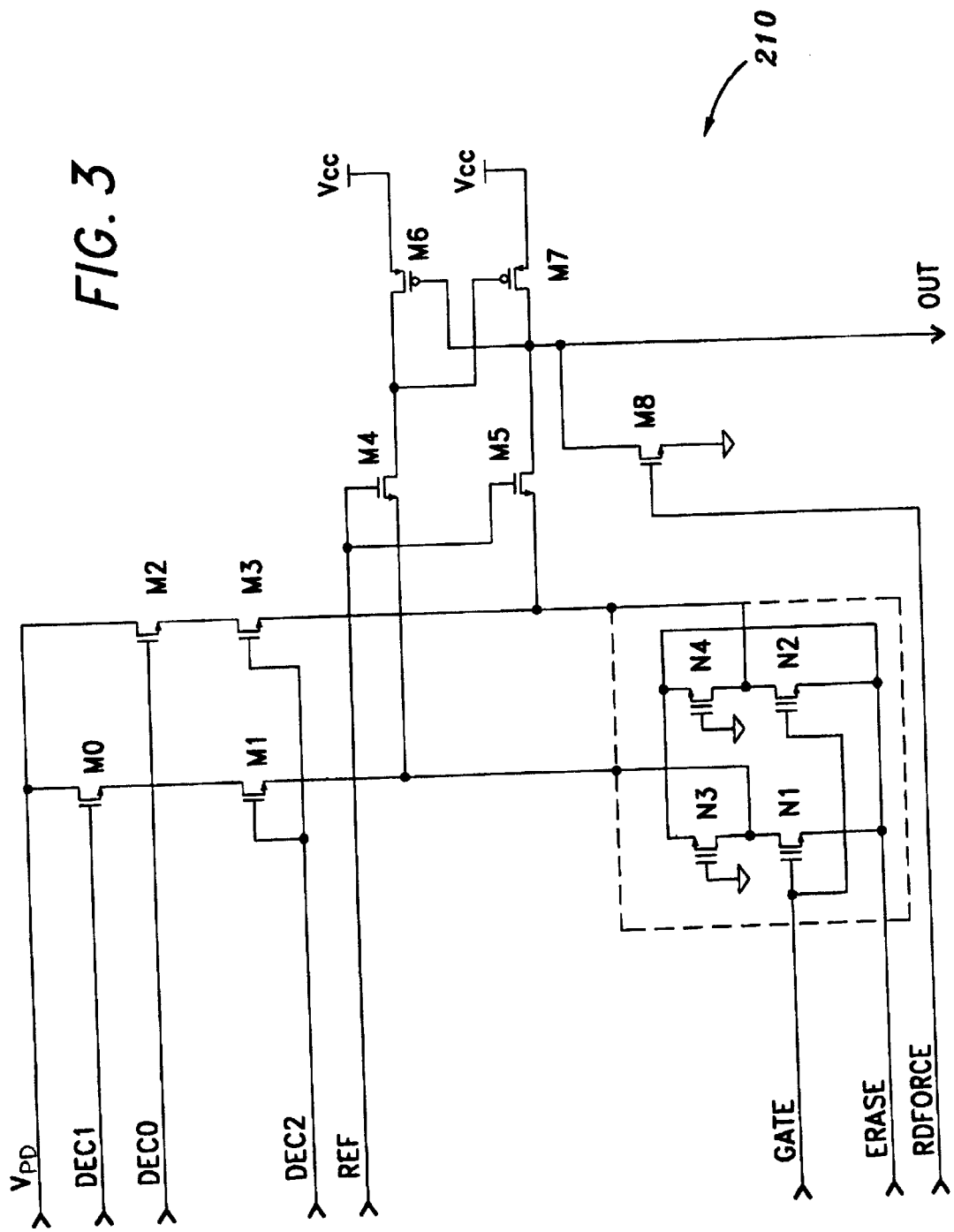
FIG. 3 illustrates a circuit diagram of a CAM cell, according to one embodiment of the present invention.

FIG. 3 illustrates a circuit diagram of a CAM cell 210, according to one embodiment of the present invention. Referring to FIG. 3, the CAM cell 210 includes non-volatile storage cells N1 and N2, and surrounding dummy storage cells N3 and N4. The storage cells N1–N4 may be FLASH, EEPROM, or other type of non-volatile memory cells. The drain voltage signal $V_{PD}$ provides programming voltage to the storage cells N1 and N2, and is passed to the drain of storage cell N1 through decode transistors M0 and M1, and to the drain of storage cell N2 through decode transistors M2 and M3. The DEC0 signal is coupled to the gate of decode transistor M2 to control the same and the DEC1 signal is coupled to the gate of decode transistor M0 to control the same, while the DEC2 signal is coupled to the gates of decode transistors M1 and M3. In one embodiment, the row decoder lines generated by main row decoders 120 are used for controlling the DEC2–DEC0 signals, and thus access to programming CAM cell 210.

The ERASE signal is applied to the sources of storage cells N1 and N2. To erase the storage cells N1 and N2, an erase voltage (e.g., 12 volts) is applied to the sources of the storage cells N1 and N2, otherwise the ERASE signal is low. In one embodiment, all of the CAM cells in the CAM memory array 130 are erased at once. The RDFORCE signal is applied to the gate of device M8, and when active, grounds the output OUT of the CAM cell 210.

The REF signal is generated by the reference circuit 140 on signal line 144 (FIG. 1), and is coupled to the gates of devices M4 and M5. When the REF signal is active, device M4 is turned on to pass the voltage on the drain of storage cell N1 to the gate of device M7 for controlling the same, and device M5 is turned on to pass the voltage on the drain of storage cell N2 to the output OUT and the gate of device M6 for controlling the same. When the REF signal is inactive, devices M4 and M5 are turned off to decouple the output OUT from the storage cell N2.

During read-back mode, the decode signals DEC2–DEC0 are de-asserted, REF is at 2 volts, GATE is at 4 volts, and ERASE and RDFORCE are low. Moreover, one of the storage cells N1 and N2 is programmed while the other is erased.

Figure 4:
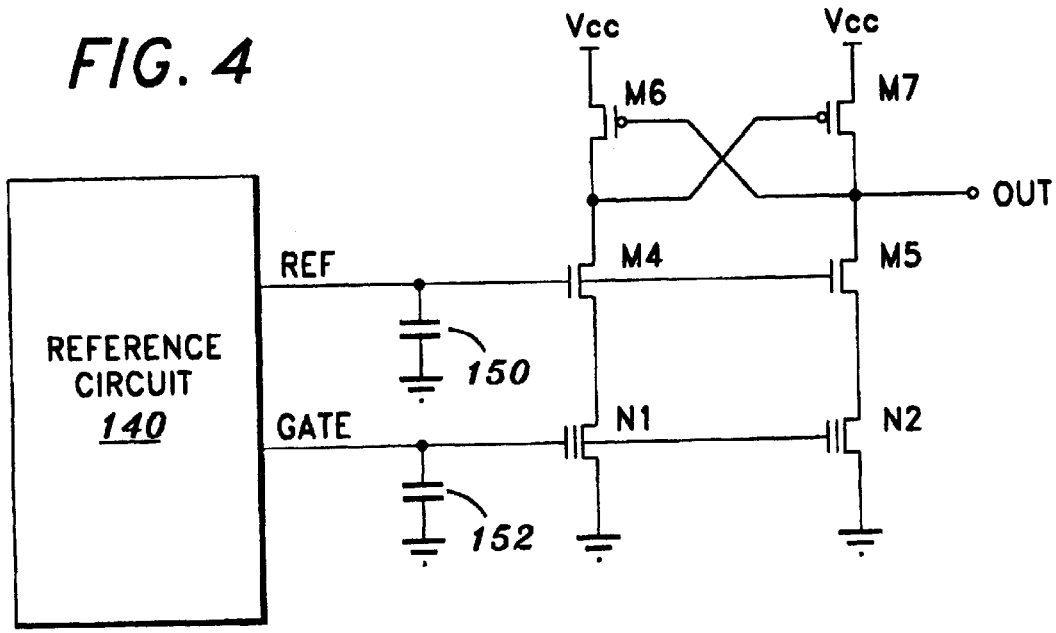
FIG. 4 shows a simplified circuit diagram of the embodiment of FIG. 3.

FIG. 4 shows a simplified circuit diagram of the embodiment of FIG. 3. Referring to FIG. 4, in a first scenario, storage cell N1 is erased (e.g., a threshold voltage of approximately 3 volts) and storage cell N2 is programmed (e.g., threshold voltage of greater than 5 volts). In this scenario, storage cell N2 is turned off to prevent current flow therethrough, and storage cell N1 is turned on, forcing its drain and, thus, the gate of device M7 low. This causes device M7 to turn on and pull the gate of device M6 and output OUT to $V_{CC}$ (e.g., 1.8 volts). M6 is turned off.

In a second scenario, storage cell N1 is programmed and storage cell N2 is erased. In this second scenario, storage cell N1 is turned off to prevent current flow therethrough, and storage cell N2 is turned on, forcing its drain low. As a result, the output OUT and the gate of device M6 are pulled low. Device M6 turns on to force the gate of M7 to $V_{CC}$ to turn off the same. In the steady state, the CAM cell 210 does not burn any current.

Figure 5:
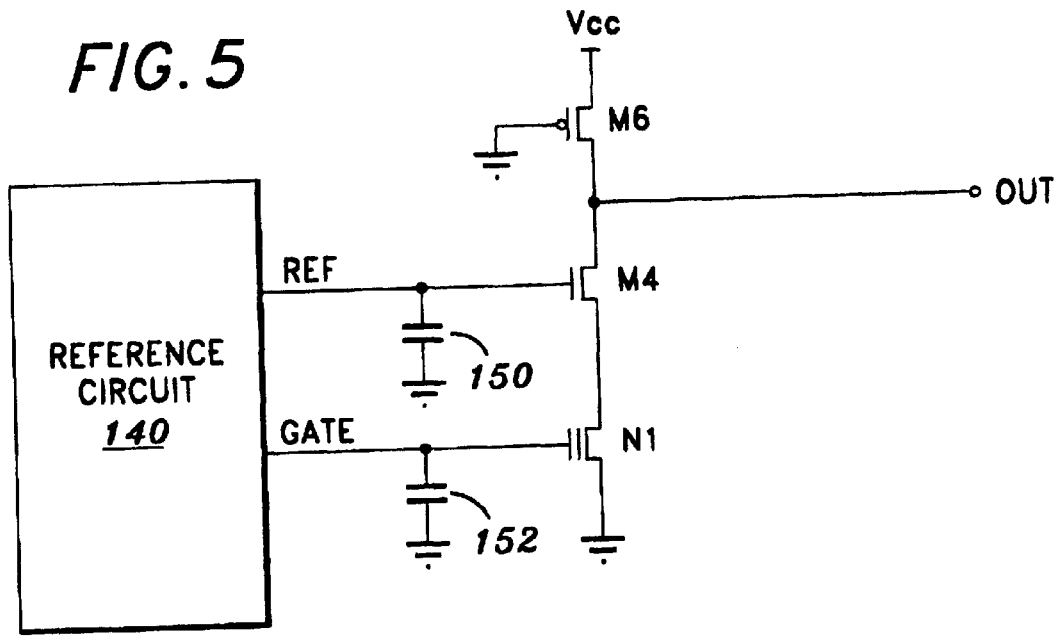
FIG. 5 shows a circuit diagram of an alternative embodiment of the present invention.

FIG. 5 shows a circuit diagram of an alternative embodiment of the present invention. Referring to FIG. 5, in the case where N1 is erased (e.g., having a threshold voltage of about 3 volts), N1 turns on to pull the output OUT low. If N1 is programmed (e.g., having a threshold voltage of greater than 5 volts), N1 turns off, and the output OUT is pulled to $V_{CC}$ by device M6. In this embodiment (without the cross-coupling arrangement), the circuit burns a little more current than the circuit of FIG. 4 in the steady state because when N1 is erased, devices N1, M4, and M6 are all on to provide a current path from $V_{CC}$ to ground.

The reference circuit 140 turns on periodically (e.g., every few milliseconds) to refresh the REF and GATE signals during read mode as well as during standby and deep power down modes. As such, during standby and deep power down modes, the REF and GATE signals are ready and the transition from those modes to read mode is very fast. In one embodiment, the read cycle time is reduced from 600 nanoseconds to 100 nanoseconds. That is, the read cycle time from deep power down mode is the same as the read cycle time during active mode.

Embodiments of the present invention provide advantages including reducing the voltage at which the CAM storage cells operate, reducing the standby current, and reducing the read cycle time. This provides low voltage non-volatile devices, which reduces battery life, especially in portable systems, and increases overall system performance.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A bias circuit for a memory cell having first and second floating gate devices and third and fourth reference devices, one of which has an output terminal coupled thereto, comprising:

a first capacitor including a first terminal coupled to the gates of the first and second devices, and a second terminal coupled to a power supply terminal;

a second capacitor including a first terminal coupled to the gates of the third and fourth devices, and a second terminal coupled to the power supply terminal; and a reference circuit including a first terminal having a first signal thereon and coupled to the gates of the first and second devices, and a second terminal having a second signal thereon and coupled to the gates of the third and fourth devices, the reference circuit to periodically turn on the first and second signals.

2. The bias circuit of claim 1 wherein the reference circuit to periodically turn on the first and second signals to refresh the first and second capacitors.

3. The bias circuit of claim 1 wherein the reference circuit generates the first signal at approximately four volts and the second signal at approximately two volts.

4. The bias circuit of claim 1 wherein the reference circuit receives a second power supply terminal having a power supply voltage thereon, and steps up the power supply voltage to generate the first and second signals.

5. A biasing method in a non-volatile memory device, comprising:

providing a non-volatile device having a gate, a source coupled to a power supply terminal, and a drain;

providing a reference device having a gate, a source coupled to the drain of the non-volatile device, and a drain coupled to an output terminal and a second power supply terminal through a resistive device;

coupling a first terminal of a bias circuit having a first signal thereon to the gate of the floating gate device and to a first terminal of a first capacitor;

coupling a second terminal of the bias circuit having a second signal thereon to the gate of the reference device and to a first terminal of a second capacitor;

coupling the second terminals of the first and second capacitors to the power supply terminal; and periodically turning on the first and second signals.

6. The biasing method of claim 5 wherein providing the non-volatile device comprises providing a non-volatile floating gate device having a gate, a source, a drain, and a floating gate.

7. The biasing method of claim 5 wherein periodically turning on the first and second signals comprises periodically turning on the first and second signals to charge the first and second capacitors, respectively.

8. The biasing method of claim 5 wherein periodically turning on the first and second signals comprises periodically tuning on the first and second signals to reduce standby current and wake up time.

9. The biasing method of claim 5 wherein the resistive device comprises one of the following: a transistor, diode, and resistor.

10. A sample and hold circuit for a memory array that includes a plurality of cells, each having at least a floating gate device, a reference device, and an output terminal, comprising:

a first capacitor including a first terminal coupled to the gates of the floating devices of the cells, and a second terminal coupled to a power supply terminal;

a second capacitor including a first terminal coupled to the gates of reference devices of the cells, and a second terminal coupled to the power supply terminal; and a reference circuit including a first terminal having a first signal thereon and coupled to the first terminal of the first capacitor, and a second terminal having a second signal thereon and coupled to the first terminal of the second capacitor, the reference circuit to periodically turn on the first and second signals.

11. The sample and hold circuit of claim 10 wherein the reference circuit to periodically turn on the first and second signals to refresh the first and second capacitors, respectively.

12. A circuit for a non-volatile device, comprising:

a first non-volatile device having a gate, drain, and source coupled to a first power supply terminal;

a second device having a gate, source coupled to the drain of the first device, and a drain coupled to an output terminal and a second power supply terminal through a resistive device;

a reference circuit including a first terminal having a first signal thereon and coupled to the gate of the first device, and a second terminal having a second signal thereon and coupled to the gate of the second device; and first and second capacitors coupled between the first and second terminals of the reference circuit, respectively, and the first power supply terminal.

13. The circuit of claim 12 wherein the reference circuit to periodically turn on the first and second signals.

14. The circuit of claim 13 wherein the reference circuit to periodically turn on the first and second signals to replenish the charge on the first and second capacitors, respectively.

15. The circuit of claim 12 wherein the first device is a floating-gate non-volatile device.

16. The circuit of claim 12 wherein the resistive device comprises one of the following: a transistor, a diode, and a resistor.

17. The circuit of claim 12 further comprising:

a third non-volatile device having a gate coupled to the first terminal of the reference circuit, a source coupled to the first power supply terminal, and a drain;

a fourth device having a gate coupled to the second terminal of the reference circuit, a source coupled to the drain of the third device, and a drain;

a fifth device having a gate coupled to the drain of the second device, a source coupled to the second power supply terminal, and a drain coupled to the drain of the fourth device;

wherein the resistive device comprises a sixth device having a gate coupled to the drain of the fourth device, a source coupled to the second power supply terminal, and a drain coupled to the drain of the second device.

18. The circuit of claim 17 wherein the first and third non-volatile devices comprise floating gate non-volatile devices.

19. The circuit of claim 17 wherein the second and fourth devices are of a first conductivity type.

20. The circuit of claim 19 wherein the fifth and sixth devices are of a second conductivity type.

21. The circuit of claim 17 wherein the second and fourth devices are N-channel devices, and the fifth and sixth devices are P-channel devices.

22. The circuit of claim 12 wherein the second power supply terminal has a power supply voltage thereon, the power supply voltage being at a lower voltage than a threshold voltage required to turn on the devices, and wherein the first and second signals generated by the reference circuit are at a sufficient voltage to turn on the first and second devices.

* * * * *